(12) United States Patent
Yoon et al.

(10) Patent No.: US 9,666,835 B2
(45) Date of Patent: May 30, 2017

(54) LIGHT EXTRACTION SUBSTRATE FOR ORGANIC LIGHT-EMITTING DEVICE COMPRISING A FIBERGLASS STRUCTURE

(71) Applicant: Corning Precision Materials Co., Ltd., Chungcheongnam-do (KR)

(72) Inventors: Kyung Min Yoon, Chungcheongnam-do (KR); Ki Yeon Lee, Chungcheongnam-do (KR); Young Suk Lee, Chungcheongnam-do (KR); Jae Ho Lee, Chungcheongnam-do (KR)

(73) Assignee: Corning Precision Materials Co., Ltd. (KR)

( * ) Notice: Subject to any disclaimer, the term of this patent is extended or adjusted under 35 U.S.C. 154(b) by 0 days.

(21) Appl. No.: 14/905,636

(22) PCT Filed: Jul. 16, 2014

(86) PCT No.: PCT/KR2014/006444
§ 371 (c)(1),
(2) Date: Jan. 15, 2016

(87) PCT Pub. No.: WO2015/009057
PCT Pub. Date: Jan. 22, 2015

(65) Prior Publication Data
US 2016/0164041 A1    Jun. 9, 2016

(30) Foreign Application Priority Data
Jul. 16, 2013  (KR) .................... 10-2013-0083657

(51) Int. Cl.
*H01L 51/52*     (2006.01)
*H01L 51/00*     (2006.01)

(52) U.S. Cl.
CPC ...... *H01L 51/5275* (2013.01); *H01L 51/0096* (2013.01); *H01L 51/5268* (2013.01); *H01L 2251/558* (2013.01); *Y02E 10/549* (2013.01)

(58) Field of Classification Search
CPC ............. H01L 51/0096; H01L 51/5265; H01L 51/5268; H01L 51/5275; H01L 51/5287; H01L 2227/32
See application file for complete search history.

(56) References Cited

U.S. PATENT DOCUMENTS

2005/0129877 A1    6/2005   Akada et al.
2010/0230667 A1    9/2010   Nakamura et al.
(Continued)

FOREIGN PATENT DOCUMENTS

JP     2004-051960 A    2/2004
JP     2008-221592 A    9/2008
(Continued)

OTHER PUBLICATIONS

International Search Report for Application No. PCT/KR2014/006444 dated Oct. 23, 2014.

*Primary Examiner* — Hoai V Pham
(74) *Attorney, Agent, or Firm* — Lerner, David, Littenberg, Krumholz & Mentlik, LLP

(57) ABSTRACT

The present invention relates to a light extraction substrate for an organic light-emitting device, a manufacturing method therefor, and an organic light-emitting device comprising the same, and more specifically, to a light extraction substrate for an organic light-emitting device which can improve the light extraction efficiency of the organic light-emitting device, a manufacturing method therefor, and an organic light-emitting device comprising the same. To this end, the present invention provides a light extraction substrate for an organic light-emitting device, a manufacturing method therefor, and an organic light emitting device com- (Continued)

prising the same. The light extraction substrate for the organic light-emitting device comprises: a base substrate; a matrix layer formed on the base substrate and made of frit; and a glass fiber structure arranged inside the matrix layer, wherein the matrix layer and the glass fiber structure form an inner light extraction layer of the organic light-emitting device.

10 Claims, 2 Drawing Sheets

(56) References Cited

U.S. PATENT DOCUMENTS

2012/0155093 A1    6/2012   Yamada et al.
2014/0319560 A1*   10/2014   Tischler ................. H01L 29/00
                                                                         257/98

FOREIGN PATENT DOCUMENTS

JP        2013-114802 A     6/2013
KR      2010-0101076 A     9/2010

* cited by examiner (a)

(b)

(c)

LIGHT EXTRACTION SUBSTRATE FOR ORGANIC LIGHT-EMITTING DEVICE COMPRISING A FIBERGLASS STRUCTURE

CROSS REFERENCE TO RELATED APPLICATIONS

The present application is a national phase entry under 35 U.S.C. §371 of International Application No. PCT/KR2014/006446, filed Jul. 16, 2014, which claims priority from Korean Application No. 10-2013-0083657, filed Jul. 16, 2013, all of which are incorporated herein by reference.

BACKGROUND OF THE INVENTION

Field of the Invention

The present invention relates to a light extraction substrate for an organic light-emitting device, a method of fabricating the same and an organic light-emitting device including the same, and more particularly, to a light extraction substrate for an organic light-emitting device which can improve the light extraction efficiency of the organic light-emitting device, a method of fabricating the same and an organic light-emitting device including the same.

Description of Related Art

In general, an organic light-emitting diode portion includes an anode, a light-emitting layer and a cathode. When a voltage is applied between the anode and the cathode, holes are injected from the anode into a hole injection layer and then migrate from the hole injection layer through a hole transport layer to an emissive layer, and electrons are injected from the cathode into an electron injection layer and then migrate from the electron injection layer through an electron transport layer to the emissive layer. Holes and electrons that are injected into the light-emitting layer recombine with each other in the emissive layer, thereby generating excitons. When such excitons transit from the excited state to the ground state, light is emitted.

Organic light-emitting displays including an organic light-emitting diode portion are divided into a passive matrix type and an active matrix type depending on the mechanism that drives an N*M number of pixels which are arranged in the shape of a matrix.

In an active matrix type, a pixel electrode which defines a light-emitting area and a unit pixel driving circuit which applies a current or voltage to the pixel electrode are positioned in a unit pixel area. The unit pixel driving circuit has at least two thin-film transistors (TFTs) and one capacitor. Due to this configuration, the unit pixel driving circuit can supply a constant current irrespective of the number of pixels, thereby realizing uniform luminance. The active matrix type organic light-emitting display consumes little power, and thus can be advantageously applied to high definition displays and large displays.

When light generated by an organic light-emitting diode portion having an internal emission efficiency of 100% exits through, for example, a transparent conductive film formed from indium tin oxide (ITO) and a glass substrate, its efficiency is about 17.5% according to Snell's Law. This decreased efficiency has a significant effect on the reduction in the internal and external luminous efficiencies in the organic light-emitting device using the glass substrate. In order to overcome this, the transmittance efficiency is increased by increasing optical light extraction efficiency. Accordingly, a number of methods for increasing the optical light extraction efficiency is under study.

Light extraction techniques of the related art include a technique of treating a surface having a texture structure on a glass plate, the technique of applying microspheres to a glass surface on which ITO is deposited, the technique of applying micro-lenses on the glass surface on which ITO is deposited, the technique of using a mesa structure, the technique of using silica aerogel on ITO and the glass surface, and the like. Among these techniques, the technique of using silica aerogel had the effect of increasing the quantity of light by 100%. However, silica aerogel is very sensitive to moisture and is unstable, thereby resulting in the reduced longevity of the device. Accordingly, this technique was commercially unavailable.

In addition, although the technique of using the micro-lenses or mesa structure increased the external light efficiency, the fabricating cost was greatly increased. This consequently causes the problem of low practicability. In addition, in the technique of using microspheres, no increase in the external luminous efficiency appeared but only the wavelength was changed due to the dispersion of light. Therefore, the method of using the texture structure that has brought the efficiency increase of 30% to the organic light-emitting device is most advantageous in terms of the longevity and cost of the device. However, since glass is amorphous, it is very difficult to form the texture structure having a certain shape on the glass plate. In addition, even if the texture is formed on the glass plate, the flatness is lowered by the texture. Consequently, the texture structure is also formed on the surface of the anode that adjoins the glass plate, whereby leakage current occurs. This consequently reduces the applicability of this technique, which is problematic.

The information disclosed in the Background of the Invention section is provided only for better understanding of the background of the invention and should not be taken as an acknowledgment or any form of suggestion that this information forms a prior art that would already be known to a person skilled in the art.

BRIEF SUMMARY OF THE INVENTION

Various aspects of the present invention provide a light extraction substrate for an organic light-emitting device which can improve the light extraction efficiency of the organic light-emitting device, a method of fabricating the same and an organic light-emitting device including the same.

In an aspect of the present invention, provided is a light extraction substrate for an organic light-emitting device. The light extraction substrate includes a base substrate; a matrix layer disposed on the base substrate, the matrix layer being formed from a frit; and a fiberglass structure disposed inside the matrix layer. The matrix layer and the fiberglass structure form an internal light extraction layer of the organic light-emitting device.

According to an embodiment of the present invention, the matrix layer and the fiberglass structure may have different refractive indices.

The fiberglass structure may be a net-shaped glass cloth.

The thickness of the glass cloth may range from 1 to 100 µm.

The aperture ratio of the glass cloth may be 20% or greater.

The transmittance of the matrix layer may be 50% or greater.

The base substrate may be formed from a frit.

The light extraction substrate may further include a planarization layer between the matrix layer and an organic light-emitting diode portion of the organic light-emitting device.

The planarization layer may be formed from a frit.

In another aspect of the present invention, provided is a method of fabricating a light extraction substrate for an organic light-emitting device. The method includes the following steps of: applying a frit paste on a base substrate; inserting a fiberglass structure into the applied frit paste; and firing the frit paste.

According to an embodiment of the present invention, the fiberglass structure inserted into the frit paste may be a net-shaped glass cloth.

The thickness of the net-shaped glass cloth may range from 1 to 100 μm.

The aperture ratio of the net-shaped glass cloth may be 20% or greater.

The base substrate on which the frit paste is applied may be formed from a frit.

The method may further include, after the step of firing the frit paste, the step of forming a planarization layer on a matrix layer formed from the frit paste into which the fiberglass structure is inserted.

The planarization layer formed on the matrix layer may be formed from a frit.

In a further aspect of the present invention, provided is an organic light-emitting device including the above-described light extraction substrate on one surface of an organic light-emitting diode portion through which light from the organic light-emitting diode portion is emitted.

According to the present invention as set forth above, the internal light extraction layer including the matrix layer formed from a highly refractive frit and the net-shaped fiberglass inserted into the matrix layer is disposed on the front side of an organic light-emitting device through which light generated by the organic light-emitting device is emitted. It is therefore possible to reduce total reflection that occurs at the boundary between the organic light-emitting diode portion and the base substrate and between the base substrate and the air. This can consequently improve the light extraction efficiency of the organic light-emitting device.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Figure 1:
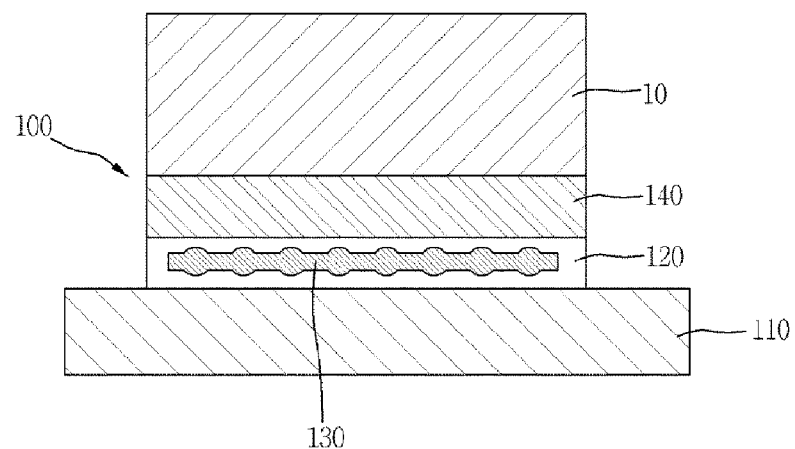
FIG. 1 is a cross-sectional view schematically showing an organic light-emitting device including a light extraction substrate for an organic light-emitting device according to an exemplary embodiment of the present invention.

Reference will now be made in detail to a light extraction substrate for an organic light-emitting device, a method of fabricating the same and an organic light-emitting device including the same according to the present invention, embodiments of which are illustrated in the accompanying drawings and described below, so that a person skilled in the art to which the present invention relates can easily put the present invention into practice.

Throughout this document, reference should be made to the drawings, in which the same reference numerals and signs are used throughout the different drawings to designate the same or similar components. In the following description of the present invention, detailed descriptions of known functions and components incorporated herein will be omitted when they may make the subject matter of the present invention unclear.

As shown in FIG. 1, according to an exemplary embodiment of the present invention, an organic light-emitting device includes an organic light-emitting diode portion 10 and a light extraction substrate 100. The light extraction substrate 100 is disposed on one surface of the organic light-emitting diode portion 10 through which light from the organic light-emitting device 10 is emitted in order to improve the light extraction efficiency of the organic light-emitting device.

Although not shown in detail, the organic light-emitting diode portion 10 has a multilayer structure in which an anode, an organic light-emitting layer and a cathode are sandwiched between the light extraction substrate 100 according to this exemplary embodiment and an encapsulation substrate that faces the light extraction substrate 100. Here, the anode can be formed from a metal or metal oxide, for example, Au, In, Sn or indium tin oxide (ITO), which has a significant work function in order to facilitate the hole injection. The cathode can be formed from a metal thin film of, for example, Al, Al:Li or Mg:Ag, which has a smaller work function in order to facilitate the electron injection. When the organic light-emitting device is a top emission type, the cathode may have a multilayer structure that includes a semitransparent electrode of a metal thin film formed from Al, Al:Li or Mg:Ag and a transparent electrode of an oxide thin film formed from, for example, ITO, in order to facilitate the transmission of light that is generated from the organic light-emitting layer. The organic light-emitting layer includes a hole injection layer, a hole transport layer, an emissive layer, an electron transport layer and an electron injection layer which are sequentially stacked on the anode.

With this structure, when a forward voltage is induced between the anode and the cathode, electrons from the cathode migrate to the emissive layer through the electron injection layer and the electron transport layer, and holes from the anode migrate to the emissive layer through the hole injection layer and the hole transport layer. The electrons and holes that have migrated into the emissive layer recombine with each other, thereby generating excitons. When these excitons transit from an excited state to a ground state, light is emitted. The brightness of the light emitted is proportional to the amount of current that flows between the anode and the cathode.

When the organic light-emitting diode portion 10 is a white OLED for lighting application, for example, the light-emitting layer can have a multilayer structure that includes a high-molecular light-emitting layer which emits blue light and a low-molecular light-emitting layer which emits orange-red light. The light-emitting layer can also have a variety of other structures to emit white light. In addition, the organic light-emitting layer can have a tandem structure. Specifically, a plurality of organic light-emitting layers can be provided such that the organic light-emitting layers alternate with interconnecting layers.

The base substrate 110 is the substrate that supports the matrix layer 120 which is disposed on one surface thereof. The base substrate 110 is also disposed at the front side of the organic light-emitting diode portion 10, i.e. in the direction in which light from the organic light-emitting diode portion is emitted, and serves as an encapsulation substrate which allows the generated light to exit through while protecting the organic light-emitting diode portion 10 from the external environment.

The base substrate 110 can be any transparent substrate that has superior light transmittance and mechanical properties. For instance, the base substrate 110 can be formed from a polymeric material, such as a thermally or ultraviolet (UV) curable organic film, or a chemically strengthened glass, such as soda-lime glass ($SiO_2$—$CaO$—$Na_2O$) or aluminosilicate glass ($SiO_2$—$Al_2O_3$—$Na_2O$). When the organic light-emitting device including the organic light-emitting diode portion 10 and the light extraction substrate 100 according to this exemplary embodiment is applied for lighting, the base substrate 110 can be formed from soda-lime glass. According to this exemplary embodiment, the base substrate 110 can be formed from a piece of thin glass having a thickness of 1.5 mm or less. The thin glass can be made by a fusion process or a floating process. Alternatively, the base substrate 110 may also be a substrate that is formed from a metal oxide or a metal nitride.

The matrix layer 120 is disposed on the base substrate 110. According to this exemplary embodiment, the matrix layer 120 is formed from a frit, more particularly, a frit, of which the refractive index n is 1.6 or greater and the transmittance is 50% or greater. The matrix layer 120 serves, together with the fiberglass structure 130 inside the matrix layer 120, as an internal light extraction layer of the organic light-emitting device. The internal light extraction layer formed between the organic light-emitting diode portion 10 and the base substrate 110 can reduce total reflection that occurs at the boundary between a conventional glass substrate and the organic light-emitting diode portion, thereby improving the light extraction efficiency of the organic light-emitting device.

The fiberglass structure 130 is disposed inside the matrix layer 120. The fiberglass structure 130 forms, together with the matrix layer 120, the internal light extraction layer of the organic light-emitting device. The refractive index of the fiberglass structure 130 can differ from the refractive index of the matrix layer 120. For instance, the refractive index of the fiberglass structure 130 can range from 1.45 to 1.7. When the fiberglass structure 130 having a different refractive index is disposed inside the matrix layer 120 in this manner, the light that passes through the matrix layer 120 is scattered, i.e. paths along which the light passes is diversified. This can consequently reduce total reflection that occurs at the boundary between the base substrate 110 and the air, thereby further improving the light extraction efficiency of the organic light-emitting device.

Figure 2:
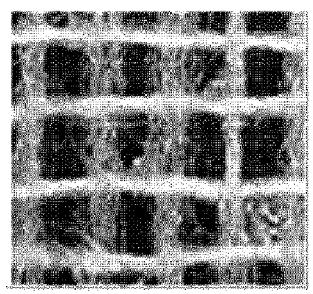
FIGS. 2(a), 2(b), and 2(c) show pictures of glass cloth employed in the light extraction substrate for an organic light-emitting device according to the exemplary embodiment of the present invention.
Figure 2:
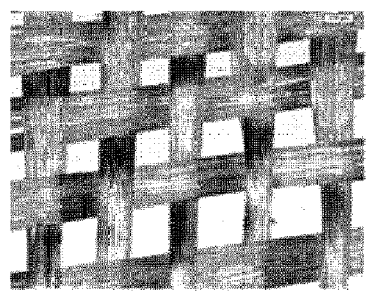
Figure 2:
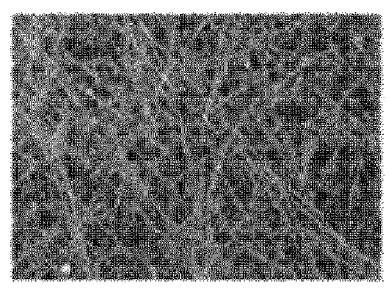

As shown in the pictures of FIGS. 2(a), 2(b), and 2(c), the fiberglass structure 130 according to this exemplary embodiment can be configured as a net-shaped glass cloth. The thickness of the glass cloth can range from 1 to 100 μm. The aperture ratio of the glass cloth can be 20% or greater. As such, the light extraction substrate 100 for an organic light-emitting device according to this exemplary embodiment can have a high level of transmittance.

When the fiberglass structure 130 is disposed inside the matrix layer 120, the geometry of the fiberglass structure 130 affects the geometry of the surface of the matrix layer 120, thereby increasing the surface roughness of the matrix layer 120. When the organic light-emitting diode portion 10 is formed on the highly rough matrix layer 120, the protrusion-depression surface of the matrix layer 120 can be transferred to the anode. This can cause a large current leakage, thereby deteriorating the electrical characteristics of the organic light-emitting device.

In order to prevent this, the planarization layer 140 is disposed between the matrix layer 120 and the organic light-emitting diode portion 10. Like the matrix layer 120, the planarization layer 140 can be formed from a frit. The composition of the frit of the planarization layer 140 can be equal to or different from that of the frit of the matrix layer 120.

As described above, the light extraction substrate 100 according to this exemplary embodiment includes the matrix layer 120 formed from a highly refractive frit and the net-shaped fiberglass structure 130 disposed inside the matrix layer 120. When the light extraction substrate 100 is applied as an internal light extraction of the organic light-emitting device, it is possible to reduce total reflection that occurs at the boundary between the organic light-emitting diode portion 10 and the base substrate 110 and between the base substrate 110 and the air, thereby improving the light extraction efficiency of the organic light-emitting device.

Figure 3:
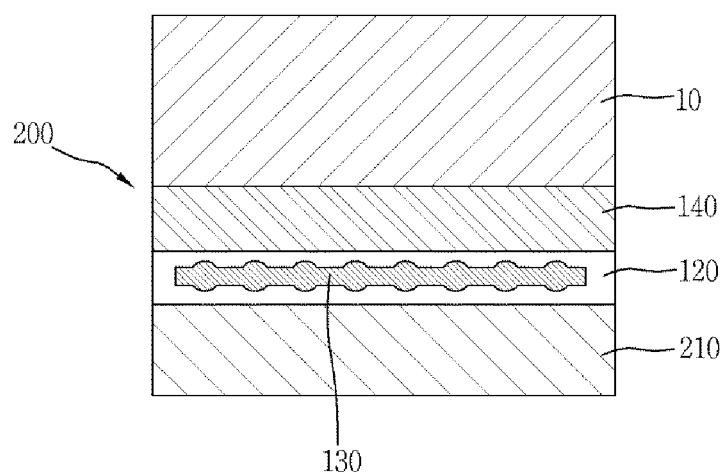
FIG. 3 is a cross-sectional view schematically showing an organic light-emitting device including a light extraction substrate for an organic light-emitting device according to another exemplary embodiment of the present invention.

In addition, FIG. 3 shows a light extraction substrate 200 for an organic light-emitting device according to another exemplary embodiment of the present invention. In this light extraction substrate 200, a base substrate 210 can be formed from a frit like the matrix layer 120 and the planarization layer 140. The composition of the frit of the base substrate 210 can be equal to that of the frit of the planarization layer 140. In this case, the base substrate 210, the matrix layer 120 and the planarization layer 140 can have the shape of one sheet.

A description will be given below of a method of fabricating a light extraction substrate for an organic light-emitting device according to an exemplary embodiment of the present invention. In this description, reference numerals for the components will refer to those in FIG. 1 and FIG. 3.

The method of fabricating a light extraction substrate for an organic light-emitting device according to this exemplary embodiment of the present invention is the method of fabricating the light extraction substrate 100 which is disposed on one surface of the organic light-emitting diode portion 10 through which light from the organic light-emitting device is emitted. The method includes a frit paste application step, a fiberglass structure insertion step and a frit paste firing step.

First, at the frit paste application step, a frit paste that is to form the matrix layer 120 when fired is applied on the base substrate 110. At the frit paste application step, the frit paste is applied on the base substrate 110 by a suitable process such as screen printing. The frit paste can be prepared by mixing frit powder into an organic solvent to which an organic binder is added. The organic solvent can be at least one selected from among, but not limited to, butyl carbitol acetate (BCA), α-terpineol (α-TPN), dibutyl phthalate (DBP), ethyl acetate, β-terpineol, cyclohexanone, cyclopentanone, hexylene glycol, high boiling point alcohol and mixtures of alcohol ester. In addition, the organic binder can be at least one selected from among, but not limited to, ethyl cellulose, ethylene glycol, propylene glycol, ethyl hydroxyethyl cellulose, phenolic resin, mixtures of ethyl cellulose and phenolic resin, ester polymer, methacrylate polymer, methacrylate polymer of lower alcohol and monobutyl ether of ethylene glycol monoacetate. At the frit paste application step, the base substrate 210 can be formed from a frit instead of a glass.

Afterwards, at the fiberglass structure insertion step, the fiberglass structure 130 is immersed into the frit paste applied on the base substrate 110. The fiberglass structure 130 can be a net-shaped glass cloth, of which the thickness ranges 1 to 100 µm and the aperture ratio is 20% or greater.

After that, at the frit paste firing step, the frit paste is fired at a temperature of 200° C. or higher. The frit paste fired in this manner forms the matrix layer 120 on the base substrate 110 in which the fiberglass structure 130 is disposed inside the matrix layer 120, and the transmittance of the matrix layer 120 is 50% or greater.

Since the surface of the matrix layer 120 has a high level of surface roughness due to the fiberglass structure 130 disposed inside the matrix layer 120, it is preferred that the planarization layer 140 formed from a frit be formed on the matrix layer 120.

The completion of the planarization layer forming step leads to the fabrication of the light extraction layer 100 or 200 that includes the base substrate 110 or 210, the matrix layer 120 disposed on the base substrate 110 or 210, the fiberglass structure 130 disposed inside the matrix layer 120 and the planarization layer 140. When the base substrate 210 formed from a frit is used, all of the base substrate 210, the matrix layer 120 and the planarization layer 140 are formed from a frit, and the fabricated light extraction substrate has the shape of one sheet.

The foregoing descriptions of specific exemplary embodiments of the present invention have been presented with respect to the drawings. They are not intended to be exhaustive or to limit the present invention to the precise forms disclosed, and obviously many modifications and variations are possible for a person having ordinary skill in the art in light of the above teachings.

It is intended therefore that the scope of the present invention not be limited to the foregoing embodiments, but be defined by the Claims appended hereto and their equivalents.

What is claimed is:

1. A light extraction substrate for an organic light-emitting device, comprising:
   a base substrate;
   a matrix layer disposed on the base substrate, the matrix layer being formed from a frit; and
   a fiberglass structure completely surrounded by the matrix layer,
   wherein the matrix layer and the fiberglass structure form an internal light extraction layer of the organic light-emitting device.

2. The light extraction substrate according to claim 1, wherein the matrix layer and the fiberglass structure have different refractive indices.

3. The light extraction substrate according to claim 1, wherein the fiberglass structure comprises a net-shaped glass cloth.

4. The light extraction substrate according to claim 3, wherein a thickness of the glass cloth ranges from 1 to 100 µm.

5. The light extraction substrate according to claim 3, wherein an aperture ratio of the glass cloth is 20% or greater.

6. The light extraction substrate according to claim 1, wherein a transmittance of the matrix layer is 50% or greater.

7. The light extraction substrate according to claim 1, wherein the base substrate is formed from a frit.

8. The light extraction substrate according to claim 1, further comprising a planarization layer between the matrix layer and an organic light-emitting diode portion of the organic light-emitting device.

9. The light extraction substrate according to claim 8, wherein the planarization layer is formed from a frit.

10. An organic light-emitting device comprising the light extraction substrate as claimed in claim 1 on one surface of an organic light-emitting diode portion of the organic light-emitting device through which light from the organic light-emitting diode portion is emitted.

* * * * *